(12) United States Patent
Frankowsky

(10) Patent No.: US 6,961,880 B2
(45) Date of Patent: Nov. 1, 2005

(54) RECORDING TEST INFORMATION TO IDENTIFY MEMORY CELL ERRORS

(75) Inventor: Gerd Frankowsky, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 754 days.

(21) Appl. No.: 09/918,933

(22) Filed: Jul. 30, 2001

(65) Prior Publication Data

US 2003/0023902 A1   Jan. 30, 2003

(51) Int. Cl.[7] ........................................... G01C 29/00
(52) U.S. Cl. ........................ 714/718; 714/736; 714/724
(58) Field of Search ............................... 714/718, 724, 714/733, 734, 736; 365/201

(56) References Cited

U.S. PATENT DOCUMENTS

| | | | | |
|---|---|---|---|---|
| 5,568,437 A | * | 10/1996 | Jamal | 365/201 |
| 5,790,559 A | * | 8/1998 | Sato | 714/720 |
| 5,856,923 A | * | 1/1999 | Jones et al. | 700/121 |
| 6,009,028 A | * | 12/1999 | Akiyama | 365/201 |

* cited by examiner

*Primary Examiner*—Phung My Chung
(74) *Attorney, Agent, or Firm*—Fish & Richardson P.C.

(57) ABSTRACT

A method of recording test information to identify a location of errors in Integrated Circuits (ICs) includes scanning a plurality of ICs with an input signal, each IC having a plurality of data locations and comparing an output response at each data location with an expected value for the data location. The method also includes storing an address in a buffer for each data location where the response at the data location does not equal the expected value corresponding to the data location.

21 Claims, 9 Drawing Sheets

RECORDING TEST INFORMATION TO IDENTIFY MEMORY CELL ERRORS

TECHNICAL FIELD

This invention relates to recording test information to identify memory cell errors in integrated circuits (ICs).

BACKGROUND

A semiconductor manufacturing test process commonly has a burn-in test processing step. A burn-in test stresses integrated circuits (ICs) at higher temperatures (e.g., 125° C.) for several hours in an effort to damage weak memory cells. A burn-in test is typically performed on ICs after the ICs have been packaged.

Some ICs have been manufactured to include redundant elements. A redundant element includes identical memory cells grouped in either a word line (WL) or a bit line (BL). In another words, one primary element on an IC could have one or more redundant elements that are identical to the primary element. If during a test process, the primary element fails, redundant elements that do not fail the test can be used in place of the primary element. Historically, implementing redundancy repairs could only occur prior to packaging, while the ICs were still on a wafer.

Recent developments in semiconductor manufacturing, like electronic fuses and wafer scale packages, make it possible to now perform repairs after the IC is packaged. Therefore, repairs after burn-in can be made to improve the yield of ICs.

SUMMARY

In general, in one aspect, the invention is directed to a method of recording test information to identify a location of errors in integrated circuits (ICs) that includes scanning a plurality of ICs with an input signal, each IC having a plurality of data locations and comparing an output response at each data location with an expected value for the data location. The method also includes storing addresses in a buffer for each data location at which the response at the data location does not equal the expected value corresponding to the data location.

One aspect further includes limiting a number of comparisons between the output response and the expected value to a specified number, filtering out ICs that have failed a front-end test, and sending a data string to a storage device containing the addresses. The data string includes a header containing an x-address, a y-address, and a scan-address; a series of device addresses; and a trailer designating the data locations, including memory cells. Each device address includes an extension. The data string can also include a header containing an x-address, a device address, and a scan address; a series of y-addresses; and a counter having a count of y-addresses. The addresses include a memory address and a location of the IC. The ICs can be tested either on a burn-in board or on a wafer.

Recording the memory failures during burn-in test allows for adequate data storage space to store the information and minimizes the amount of processing time. Once the memory failure data is available, repairs can be made after burn-in to enable redundant elements.

In another aspect, the invention is directed to a system of recording test information to identify a location of an error for integrated circuits (ICs). The system includes at least one comparator comparing an output response at each of a plurality of data locations in a plurality of ICs. The comparator receives an expected value corresponding to the data locations. A processor scans a comparator at each data location and sends addresses to a buffer when the response at each data location does not equal the expected value.

DETAILED DESCRIPTION

Figure 1:
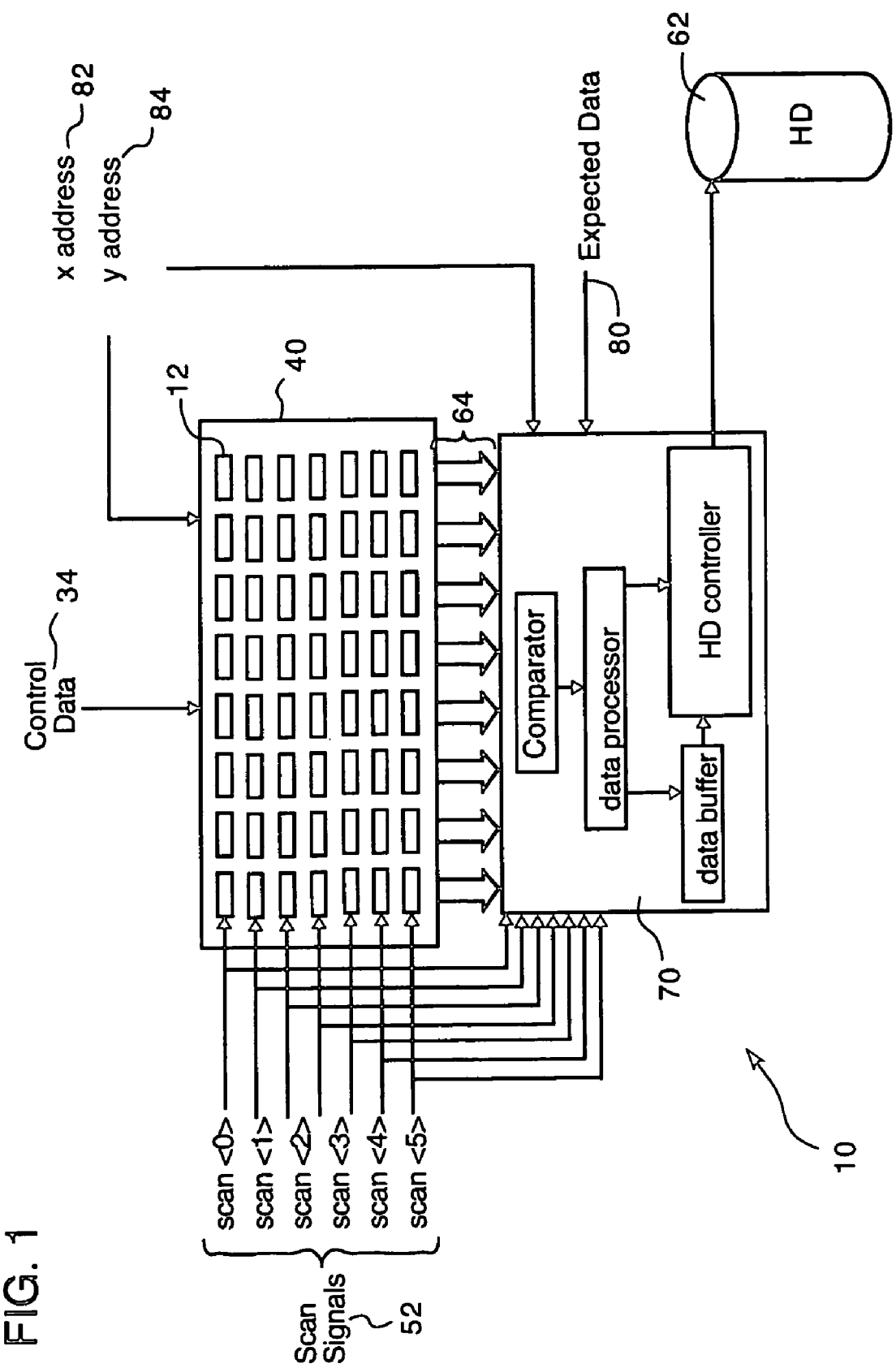
FIG. 1 is a burn-in test system.

Since integrated circuit (IC) components include fuse access and redundant elements, these features can be used to repair ICs after a burn-in process to reduce the loss of ICs during manufacturing testing. In order to make these repairs, a specific memory location of each memory cell error must be identified within the IC and recorded during testing so that the proper repairs may be made. However, the results of all memory tests that include both good and bad IC memory cells cannot be recorded due to the amount of hard drive space required to capture this data. For example, a typical back-end test system tests 6,000 to 8,000 ICs simultaneously. If each IC has a 128 Mbit memory, the size of the memory storage required to record all the test information would be approximately 125 GB per test. Referring to FIG. 1, a burn-in test system 10 identifies and records memory errors for only those ICs with memory cell errors. As will be explained in detail below, the burn-in test system 10 has a test data recording system 70 that compares the expected data with the actual data generated by an IC 12. The test data recording system 70 saves, to a storage device 62, addresses of the memory cell failures. Test data recording system 70 also identifies the IC that has the memory cell error.

Figure 2:
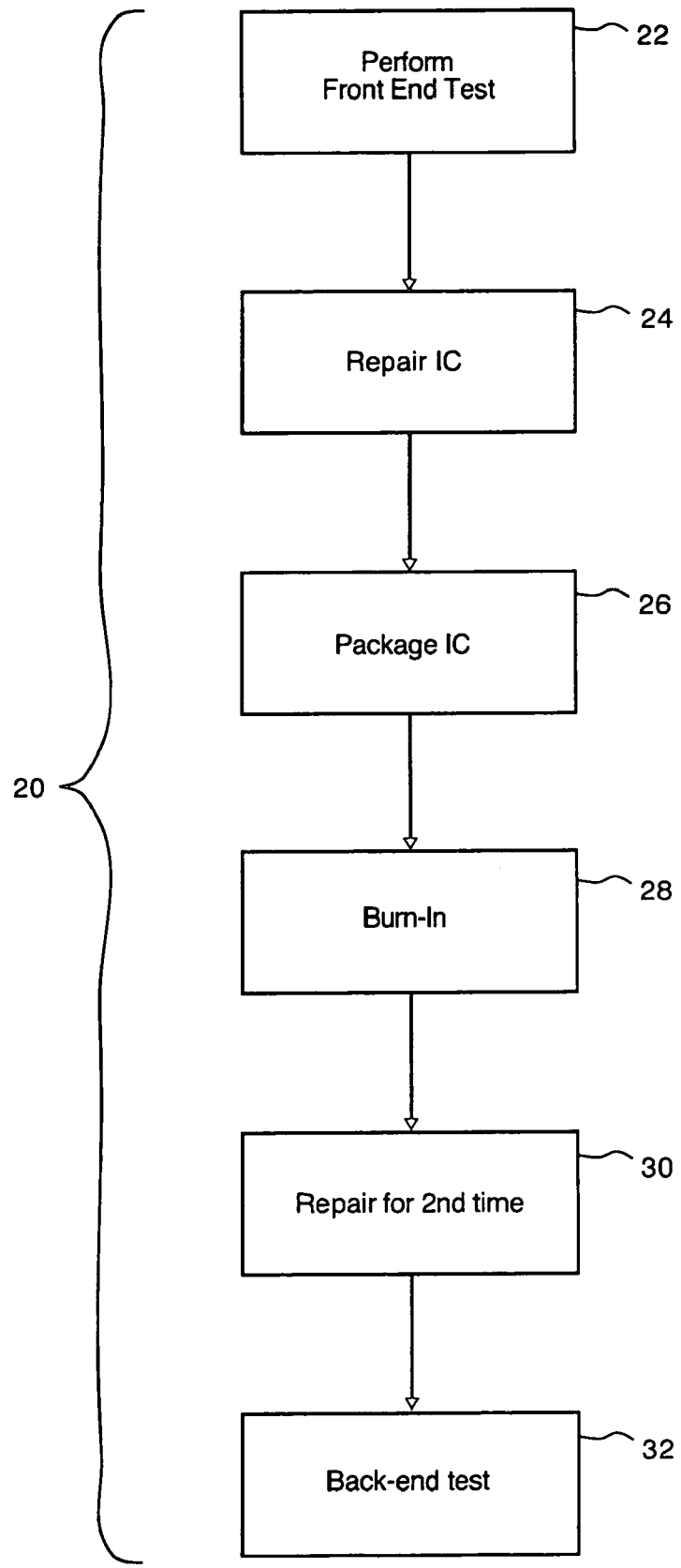
FIG. 2 is a test flow diagram.

Referring to FIG. 2, a test process 20 includes a front-end test (step 22). Front-end (FE) test (step 22) is a functional test that determines which elements are damaged by testing the ICs while still on a wafer. Once the errors are located, repair (step 24) is made to enable the redundant elements. In some cases a high number of failures requires a complex redundancy calculation to affect repair. The ICs are cut from the wafers and placed (step 26) into packages. A burn-in test (step 28) occurs to test the ICs at high temperatures to damage weak memory cells. Test process 20 includes an additional step from conventional test flows of having a second repair step (step 30) after burn-in (step 28). Second repair step (step 30) can be performed to repair those elements that have failed burn-in test since test data recording system 70 recorded the memory addresses of the memory cell failures. The second repair step (step 30) is facilitated by manufacturing the ICs to have fuse access by either having open fuse windows or electrical fuses. In addition, repairs can only be made if unused redundant elements were also tested and stressed during burn-in (step 28). Thus, if the primary element fails, redundant elements can be used in place of the primary element. The last step in process 20 includes a back-end test (step 32) that includes additional functional tests and high speed tests. High speed tests include speed sort and interface test.

Referring back to FIG. 1, a burn-in test system 10 has a burn-in board 40, a test data recording system 70 and a hard drive 62. Burn-in board 40 sends pass/fail data 64 to test data recording system 70. Pass/fail data represents the response from each IC 12 when a control test pattern 34 is applied to each IC 12. Test data recording system 70 captures only the addresses of the memory cell failures from pass/fail data 64 and sends them to be stored in hard drive 62.

Figure 3:
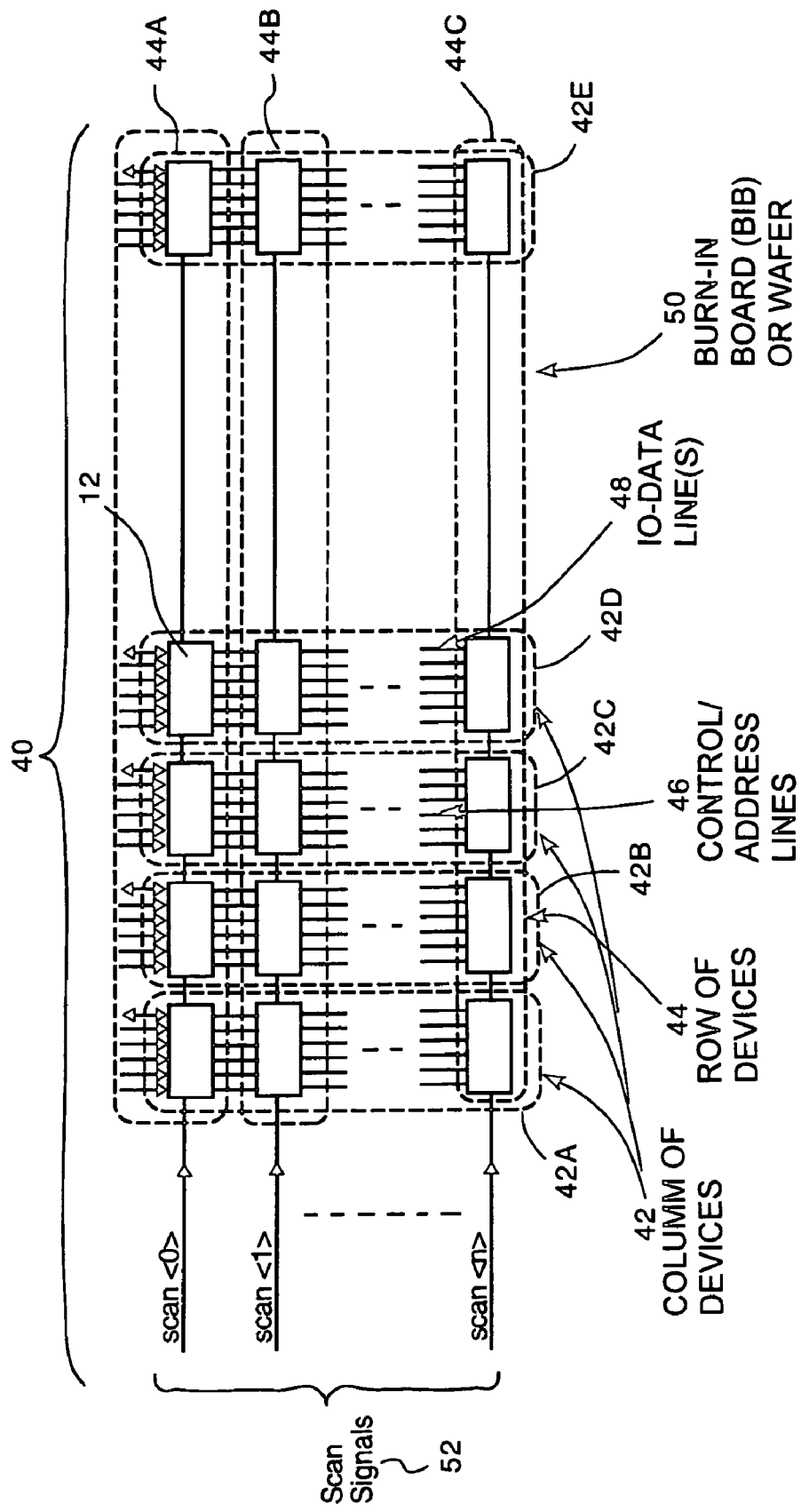
FIG. 3 is a functional diagram of a burn-in board.

Referring to FIG. 3, burn-in board 40 has ICs 12 arranged in a number of columns 42 (e.g., column 42a, Column 42b, column 42c, column 42d, and column 42e) and in a number of rows 44 (e.g., row 44a, row 44b, and row 44c). Each column 42 is connected in parallel with other columns so that control/address lines 46 provide the same input for each IC 12 in the column. Control test pattern 34 is sent through control/address lines 46. Input/output (I/O) lines 48 provide the response to control test pattern 34 by sending pass/fail data 64 to test data recording system 70. Burn-in board 40 receives input from a series of scan signals 52. Each scan signal 52 (e.g., scan 0, scan 1, scan 2, scan 3, scan 4, and scan 5 ) is shared by devices within the same row 44. During operation, only one of the scan signals 52 is activated at a time. Therefore, only one row is activated during testing. Scan signals 52 also allow individual IC read-access so that only one IC within a column can be active. This avoids data contention.

Figure 4:
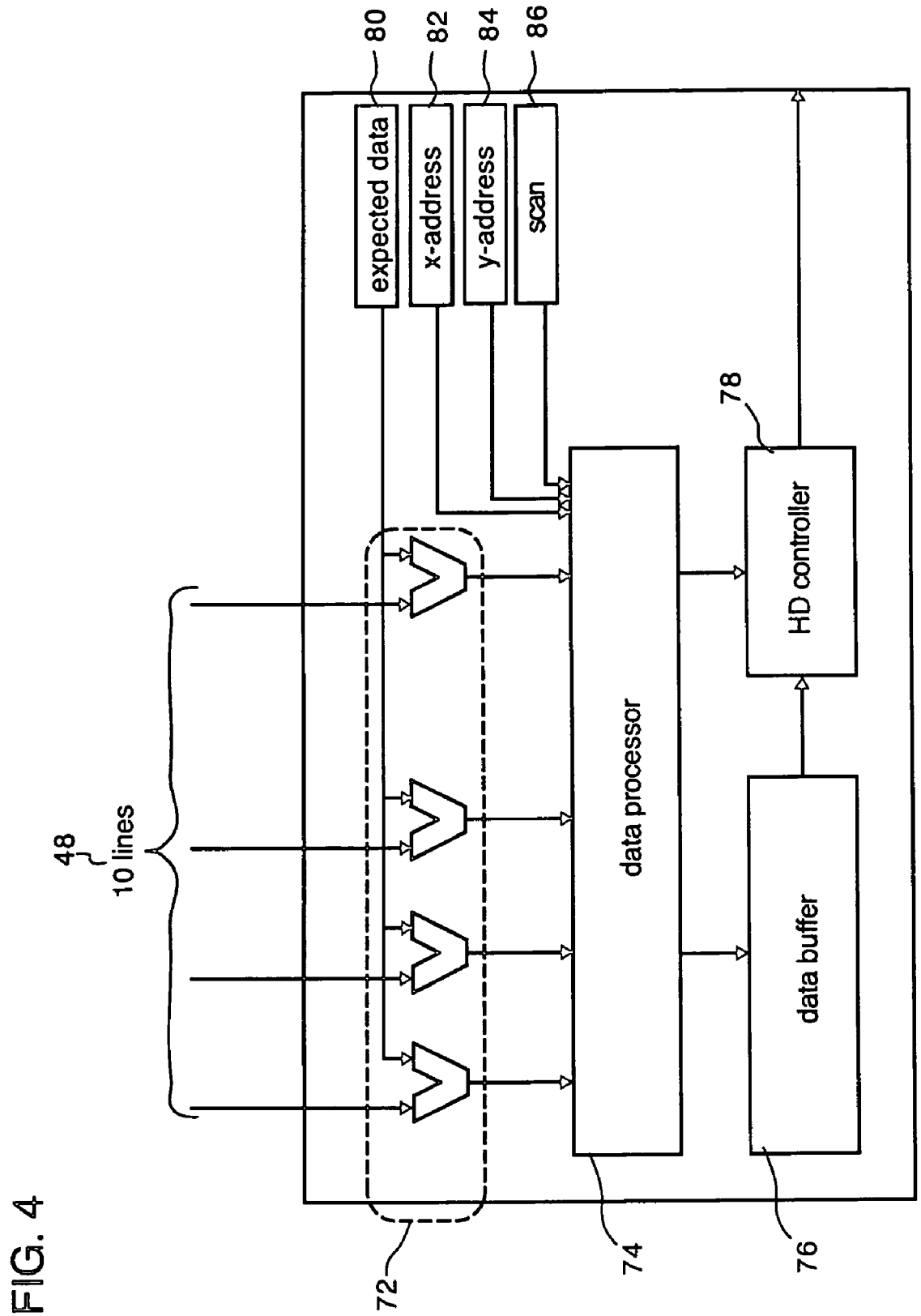
FIG. 4 is a functional diagram of a test data recording system.

Referring to FIG. 4, the test data recording system 70 includes a comparator 72, a data processor 74, a data buffer 76 and a hard drive controller 78. I/O lines 48 provide pass/fail data 64 to comparator 72. Comparator 72 also receives an expected data set 80. Expected data set 80 is the response value expected from each memory cell location when a test pattern is applied to control/address lines 46. For every memory cell location where expected data 80 does not match pass/fail data 64 from IC 12, data processor 74 sends to buffer 76 the memory cell location as an x-address 82 and a y-address 84. x-address 82 and y-address 84 are supplied by a tester (not shown). Data processor 74 also sends the location of IC 12 in the array. This location is determined by reading a scan address 86 and the device address. Scan address 86 includes the positions of each IC failure within a row 44. Scan address 86 specifies the bank or row of ICs for each scan (e.g., scan0, scan1, etc). Thus, scan address 86 and the device address give the specific location of an IC on a burn-in board.

When testing is complete, processor 74 sends a signal to hard drive controller 78 to release the addresses of the memory cell failures in data buffer 76 to hard drive controller 78 for storage on hard drive 62. In other embodiments release of the memory addresses from data buffer 76 occurs during testing.

Figure 5:
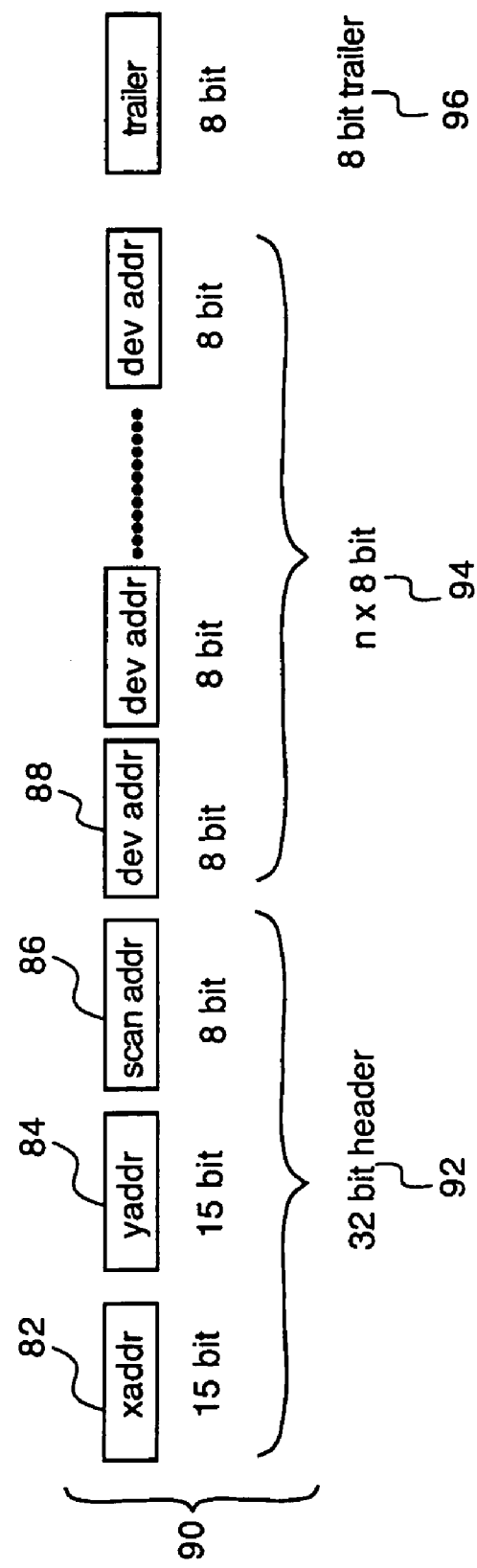
FIG. 5 is a data format used by the test data recording system.

Referring to FIG. 5, a message protocol 90 is used to send the memory cell failures from data processor 74 to data buffer 76. Message protocol 90 has a header 92 that contains x-address 82, y-address 84 and scan address 86. Message protocol 90 also includes a series of device addresses 94 where each device address 88 is an address of an IC that has failed within the scanned row. For example, if a row has 12 ICs and the fifth, eight, and eleventh ICs have memory cell failures, the series of device addresses 94 would have 5, 8, and 11 represented in bit form.

Message protocol 90 ends with a trailer 96 to indicate the end of transmission. The trailer 96 can be, for example, a non-existent device address. In this embodiment, x-address 82 is 15 bits, y-address 84 is 15 bits and scan address 86 is 8 bits to form a 38-bit header 92. Device addresses 88 are each 8 bits long so that the series of device addresses 94 is equal to n×8 bits, where n is the number of ICs having memory cell errors.

By only sending the addresses of the memory cell failures and the locations of the ICs to be recorded, the system 70 saves computer processing time and hard drive storage space. For example, a wafer has approximately 1400 ICs. Assuming the Front End test yield is 85% and the burn-in yield is 90% then there are 119 bad chips per wafer. Assuming further, that there are 20 bad cells per chip, column select (CSL) defects on 5 chips (or 4096 word Lines), and all the defective ICs are in different scan rows, then there are 150 kB of memory cell failure addresses per wafer. If there were 25 wafers per system per test, then 3.7 MB would be required to store the test information. If there is a one second pattern load time and 30 megabytes per hard drive transfer rate, then the required time for data transfer is only 0.12 seconds. This transfer time can be hidden during the control test pattern load.

Figure 6:
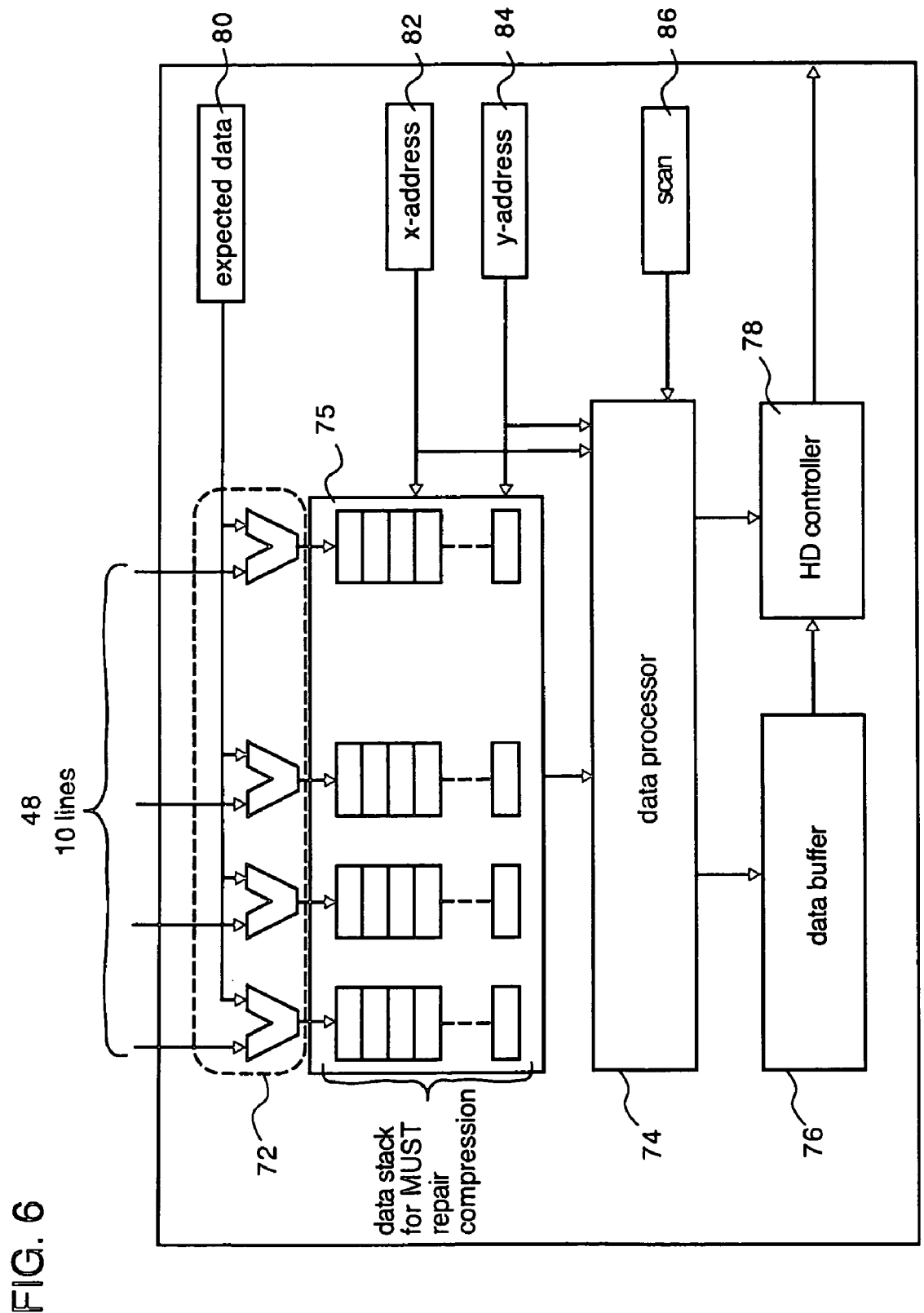
FIG. 6 is a second example of the test data recording system.

Referring to FIG. 6, in other embodiments, a set of data stacks 75 for a "must repair" compression can be added to test data recording system 70 to reduce file size and transfer time of the memory error data locations for bit line (BL) or word line (WL) failures. Whenever the number of failures detected on an element (WL or BL) exceeds a certain threshold, a repair is only possible by replacing this element with a redundant element. To accomplish this, each comparator is connected to a data stack. For example, comparator 72a is connected to data stack 75a, comparator 72b is connected to data stack 75b, and so forth. The depth of each data stack is set to the number of failures that can be repaired from the "opposite" direction. In other words, in the case of a fast x-pattern, y-addresses are stored on the data stack. After the last y-address, data processor 74 transfers and formats the memory cell failure data. (Likewise in a fast y-pattern, x-addresses are stored on the data stack). Since only a limited number of failures on a WL can be repaired using redundant BLs, only a limited number of failures have to be stored. This type of compression reduces the required data storage needed to store the memory failures to less than 1 MB per test.

Figure 7:
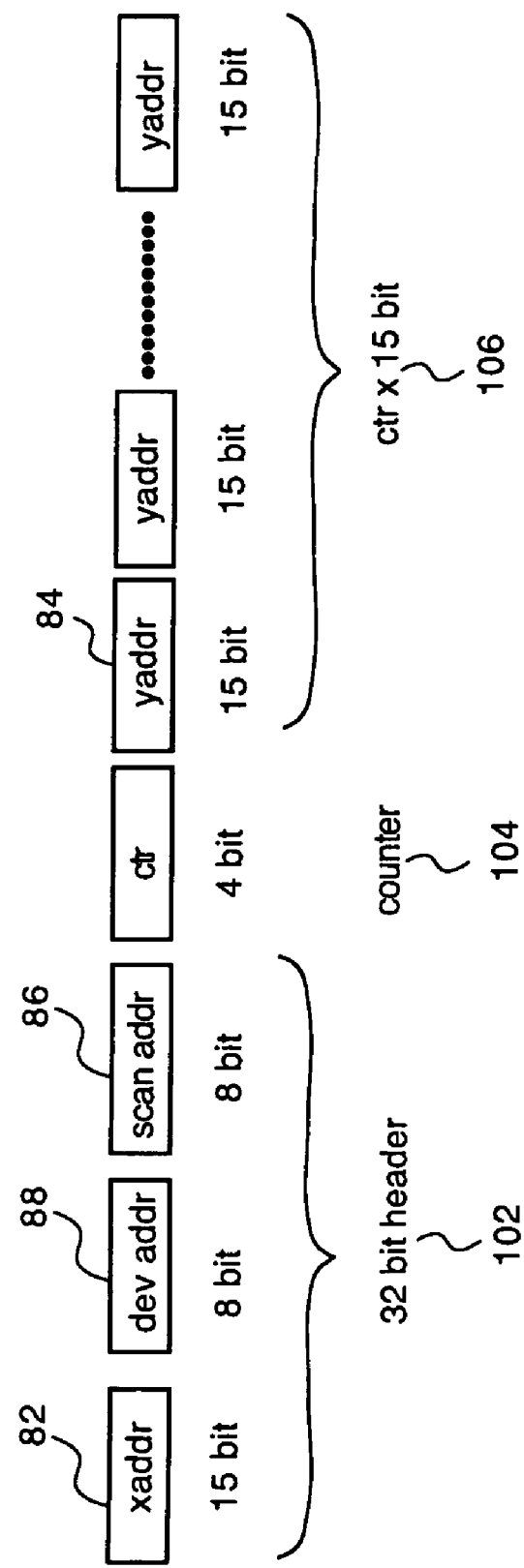
FIG. 7 is a data format used in the second example.

Referring to FIG. 7, a data protocol for this second example includes a header 102, a counter 104 and a series of y-addresses 106 for each failure. For example, a 38-bit header 102 would have a 15-bit x-address 82, an 8-bit device address 88 and an 8-bit scan address 86. A 4-bit counter (ctr) 104 increments once for every failed device up to 16 addresses. No trailer is needed, as in the first example, because counter 104 indicates how many y-addresses will follow. The second example offers substantial savings over the first example. For instance, assuming again that there are 119 bad ICs per wafer and assuming also that there are 20 bad cells per IC, CSL defects on 5 ICs (16 failures each) and all defects occur in different banks, then there are 23 KB of failure information per wafer per test. If there are 25 wafers per test, there is 0.54 MB per test of failure information. Assuming a 30 MB per second hard drive transfer rate, the required time for data transfer is 0.02 seconds. Again, this can be hidden during a pattern load.

Figure 8:
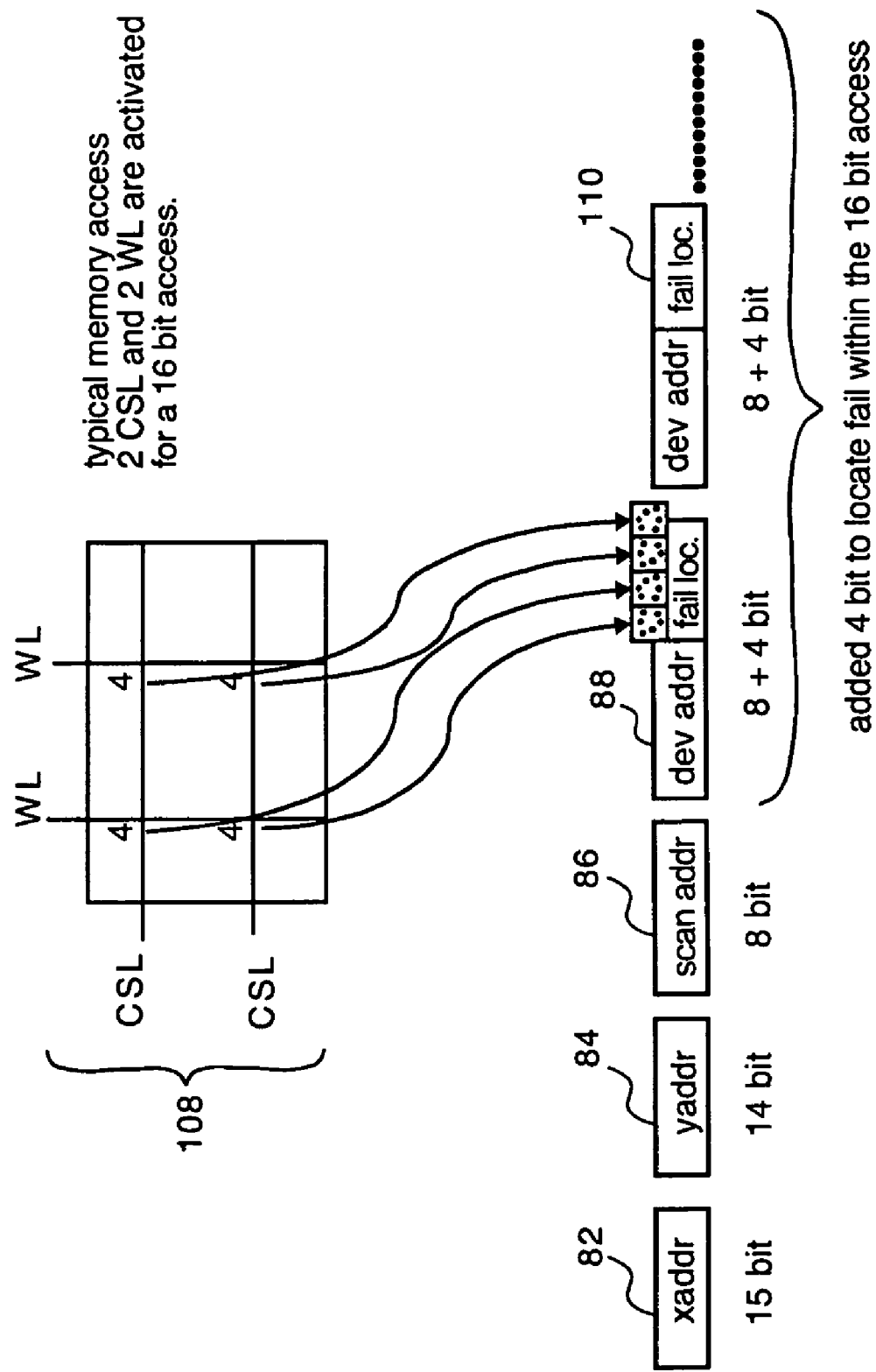
FIG. 8 is a third example using an extended transfer protocol.

Referring to FIG. 8 an extended data format can be used to format the data. In a typical memory access, 2 WLs and 2 CSLs forming a memory cell are activated for a 16-bit access 108. Therefore, a 4-bit extension 110 is added to the 8-bit device address 88 to specify the failure location within the 16-bit access 108.

Figure 9:
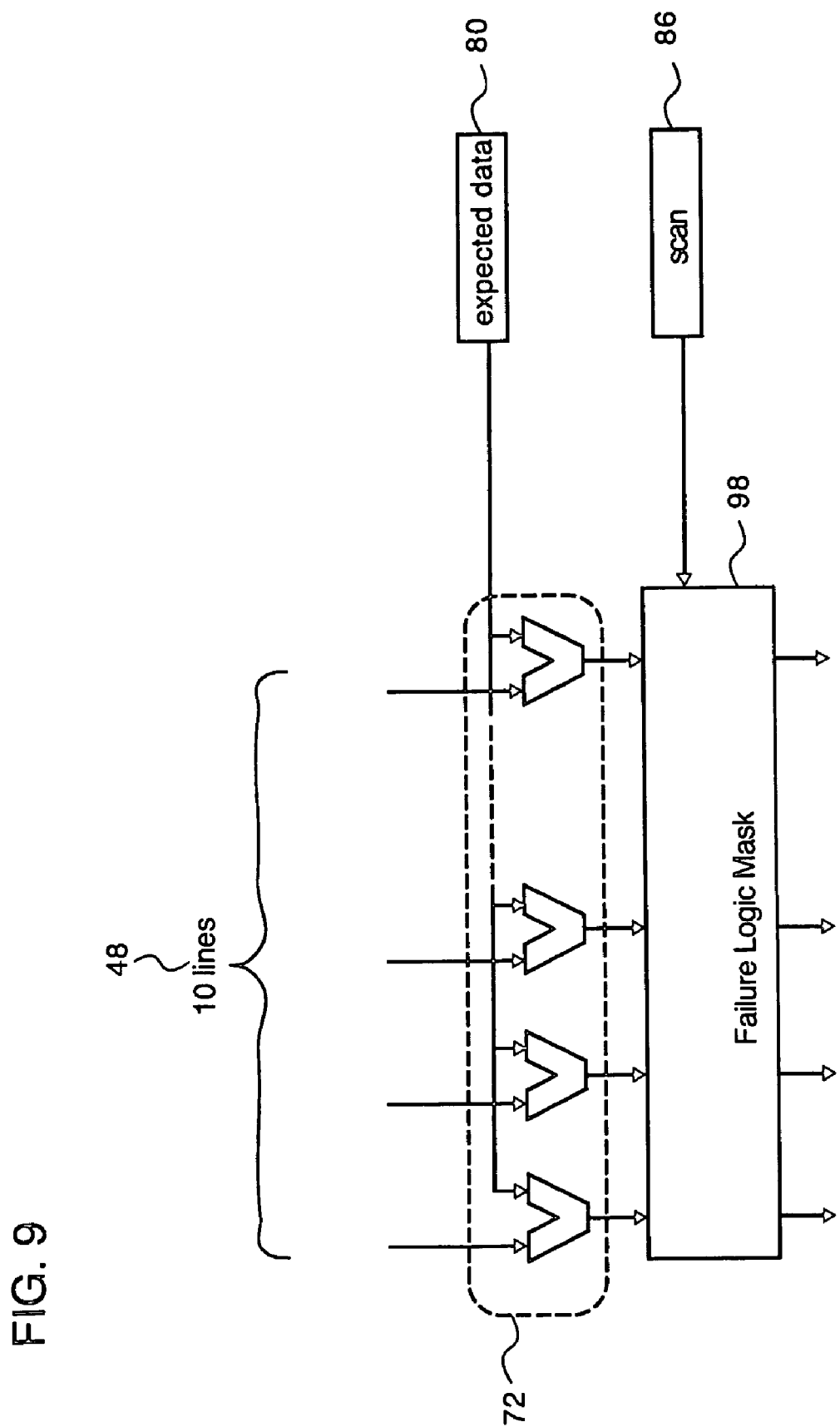
FIG. 9 is a fourth example used in a wafer level burn-in (WLBI).

In other embodiments, the test data recording system 70 tests ICs 12 while ICs 12 are still on wafers instead of on a burn-in board. This test method is called wafer level burn-in (WLBI). Referring to FIG. 9, WLBI systems can prevent the recording of irrelevant information from defective ICs identified in the FE test by adding a failure logic mask 98 to comparator 72 outputs. Failure logic mask 98 contains a bit map that represents the FE wafer test map (1-bit pass/fail information). As a result, the output of the comparator is disabled for defective ICs. This prevents test data recording system 70 from processing memory cell information for these ICs.

Other embodiments not described here are also within the scope of the following claims.

What is claimed is:

1. A method for recording test information to identify locations of errors in integrated circuits (ICs), comprising:
    scanning ICs with an input signal, each IC having data locations;
    comparing outputs at locations with expected values for the data locations; and
    storing addresses in a buffer for data locations at which an output does not equal the an expected value;
    wherein, after a pre-determined number of addresses are stored in the buffer, addresses for data locations at which an output does not equal an expected value are not stored in the buffer.

2. The method of claim 1, further comprising sending a data string containing the addresses stored in the buffer to a storage device.

3. The method of claim 2, wherein sending the data string comprises:
    sending a header containing an x-address, a device address, and a scan address for each of the data locations;
    sending y-addresses; and
    sending a counter having a count of y-addresses.

4. The method of claim 2, wherein sending the data string comprises sending a memory address and a location of the IC.

5. The method of claim 1, further comprising placing the ICs on a burn-in board and scanning the ICs with the input signal in order to determine defective ICs, the defective ICs corresponding to data locations at which the output does not equal the expected value;
    wherein placing the ICs on the burn-in board comprises arranging the ICs in columns and rows, the columns being connected in parallel with other columns and being configured to receive the input signal through the data locations.

6. The method of claim 1, further comprising
    leaving the ICs on a wafer and scanning the ICs with the input signal in order to determine defective ICs, the defective ICs corresponding to data locations at which the output does not equal the expected value.

7. The method of claim 1, wherein the data locations comprise memory cells.

8. The method of claim 1, further comprising filtering out defective ICs, the defective ICs corresponding to data locations at which the output does not equal the expected value;
    wherein the filtering comprises:
        locating the defective ICs on a bum-in board or a wafer;
        repairing the defective ICs;
        removing non-defective ICs from the bum-on board or the wafer, the non-defective ICs corresponding to data locations at which the output eciuals the expected value; and
        storing the non-defective ICs into packages.

9. A method for recording test information to identify locations of errors in integrated circuits (ICs), comprising:
    scanning ICs with an input signal, each IC having data locations;
    comparing output at locations with expected values for the data locations; and
    storing addresses in a buffer for data locations at which an output does not equal an expected value not stored in the buffer;
    sending a data string containing the addresses stored in the buffer to a storage device;
    wherein sending the data string comprises:
        (i) sending a header containing an x-address, a y-address, and a scan-address for each of the data locations;
        (ii) sending device addresses; and
        (iii) sending a trailer.

10. The method of claim 9, wherein the device addresses comprises an extension.

11. A system for recording test information to identify a location of an error for integrated circuits (ICs), comprising:
    at least one comparator to compare outputs at locations with expected values for the data locations; and
    a processor to scan the at least one comparator at data locations and to store addresses to a buffer when an output for data locations does not equal an expected value;
    wherein, after a pre-determined number of addresses are stored in the buffer, addresses for data locations at which an output does not equal an expected value are not stored in the buffer.

12. The system of claim 11, further comprising a data storage device that receives addresses from the processor in a data string.

13. The system of claim 12, wherein the data string comprises:
    a header containing an x-address, a device address, and a scan address for each of the data locations;
    y-addresses; and
    a counter having a count of y-addresses.

14. The system of claim 12, wherein the addresses comprises a memory address and a location of the IC.

15. The system of claim 11, wherein the ICs are placed on a burn-in board and scanned with the input signal in order to determine defective ICs, the defective ICs corresponding to data locations at which the output does not equal the expected value;
    wherein placing the ICs on the bum-in board comprises arranging the ICs in columns and rows, the columns being connected in parallel with other columns and being configured to receive the input signal through the data locations.

16. The system of claim 11, wherein the ICs are placed on a wafer and scanned with the input signal in order to determine defective ICs, the defective ICs corresponding to data locations at which the output does not equal the expected value.

17. The system of claim 11, wherein the data locations comprise memory cells.

18. The system of claim 11, further comprising a data stack being connected to the comparator, the data stack being configured to:
   determine a Quantity of failures for each of the ICs on the burn-in board or the wafer;
   replace an ICs with a redundant element after the quantity of failures for the IC exceeds a threshold.

19. The system of claim 11, further comprising a logic mask, the logic mask comprising a bit map and being configured to prevent the recording of irrelevant information from defective ICs, the defective ICs corresponding to data locations at which the output does not equal the expected value.

20. A system for recording test information to identify locations of errors for integrated circuits (ICs), comprising:
   at least one comparator comparing outputs at locations with expected values for the data locations;
   a processor to scan at least one comparator at data locations and to store addresses to a buffer when an output for data locations does not equal an expected value; and
   a data storage device that receives addresses from the processor in a data string;
   wherein the data string comprises:
      (i) a header containing an x-address, a y-address, and a scan-address for each of the data locations;
      (ii) device addresses; and
      (iii) a trailer.

21. The system of claim 20 wherein each device address includes an extension.

* * * * *